(12) United States Patent
De Langen et al.

(10) Patent No.: US 8,344,740 B2
(45) Date of Patent: Jan. 1, 2013

(54) SYSTEM FOR DIAGNOSING IMPEDANCES HAVING ACCURATE CURRENT SOURCE AND ACCURATE VOLTAGE LEVEL-SHIFT

(75) Inventors: Klaas-Jan De Langen, Nijmegen (NL); Johan Witte, Delft (NL)

(73) Assignee: NXP B.V., Eindhoven (NL)

( * ) Notice: Subject to any disclaimer, the term of this patent is extended or adjusted under 35 U.S.C. 154(b) by 949 days.

(21) Appl. No.: 11/718,218

(22) PCT Filed: Oct. 28, 2005

(86) PCT No.: PCT/IB2005/053541
§ 371 (c)(1),
(2), (4) Date: Mar. 13, 2009

(87) PCT Pub. No.: WO2006/046218
PCT Pub. Date: May 4, 2006

(65) Prior Publication Data
US 2009/0160459 A1  Jun. 25, 2009

Related U.S. Application Data

(60) Provisional application No. 60/522,715, filed on Oct. 29, 2004.

(51) Int. Cl.
G01R 27/26  (2006.01)

(52) U.S. Cl. .................. 324/684; 324/685; 324/686
(58) Field of Classification Search ............ 324/684, 324/685, 548, 691–724; 323/313, 315
See application file for complete search history.

(56) References Cited

U.S. PATENT DOCUMENTS

| 4,652,144 | A | * | 3/1987 | Gunther et al. ............ 327/512 |
| 4,952,865 | A | * | 8/1990 | Pataut et al. .............. 323/313 |
| 5,045,835 | A | | 9/1991 | Masegi et al. |
| 6,100,753 | A | | 8/2000 | Lee et al. |
| 6,124,754 | A | | 9/2000 | Afghahi |
| 6,448,784 | B1 | | 9/2002 | Belau et al. |
| 6,486,566 | B1 | | 11/2002 | Schumacher et al. |

(Continued)

FOREIGN PATENT DOCUMENTS

DE  3744524 A1  7/1989

(Continued)

OTHER PUBLICATIONS

Patent Abstracts of Japan, vol. 2003 No. 12, Dec. 5, 2003.

*Primary Examiner* — Jermele M Hollington
*Assistant Examiner* — Alesa Allgood (57) ABSTRACT

The present invention relates to a system for measuring a capacitor (C). A current source (12) is connected in parallel to the capacitor (C) between a supply plane (Vc) and ground $_{(VGND)}$ for providing a current to the capacitor (C). A voltage level-shift is connected between the supply plane (Vc) and the ground $_{(VGND)}$ in parallel to the capacitor (C) and in parallel to the current source (I2). The voltage level-shift senses a voltage across the electronic component (C) and provides a level-shifted output voltage $V_{out}$ in dependence thereupon. The voltage level-shift comprises a resistor ($R_I$) connected in series with a current source (I1) and an output port interposed between the resistor (RI) and the current source (I1). The current sources (I,) and (12) have opposite temperature coefficients such that the current provided to the electronic component is substantially constant.

18 Claims, 7 Drawing Sheets

U.S. PATENT DOCUMENTS

| | | |
|---|---|---|
| 6,498,738 B1 | 12/2002 | Orita et al. |
| 6,580,279 B1 | 6/2003 | Baumgartner et al. |
| 6,690,144 B1 * | 2/2004 | DeNicholas et al. ......... 323/222 |
| 6,822,505 B1 * | 11/2004 | Palaskas et al. ............... 327/551 |
| 2003/0090299 A1 | 5/2003 | Dathe et al. |
| 2004/0036460 A1 * | 2/2004 | Chatal .......................... 323/313 |

FOREIGN PATENT DOCUMENTS

| | | |
|---|---|---|
| DE | 10156026 A1 | 6/2003 |
| DE | 10158268 A1 | 6/2003 |
| GB | 2332110 A | 9/1999 |
| JP | 2004276633 A | 10/2004 |

* cited by examiner

SYSTEM FOR DIAGNOSING IMPEDANCES HAVING ACCURATE CURRENT SOURCE AND ACCURATE VOLTAGE LEVEL-SHIFT

This invention relates to airbag safety systems and in particular to a circuit for diagnosing capacitors used for firing airbag detonators.

Airbags are commonplace in automotive vehicles to improve occupant safety in collisions. In fact, nowadays airbags are standard equipment in many, if not most, late model automotive vehicles. Airbags are typically located in strategic places, such as the steering wheel of a vehicle, and are intended to reduce occupant injury in the event of a crash. An airbag system must trigger reliably in the event of an accident. To that end, at least one storage capacitor is provided to store the energy required to fire the airbag detonators. In order to guarantee reliable operation of these safety systems the storage capacitors are diagnosed, for example, when the ignition key is turned prior to starting the vehicle or in predetermined intervals.

Systems for monitoring the operability of airbag systems are known in the art and are disclosed, for example, in U.S. Pat. No. 6,486,566 issued Nov. 26, 2002 to Schumacher et al. and in U.S. Pat. No. 6,448,784 issued Sep. 10, 2002 to Belau et al.

The voltage level-shift in current capacitor measuring circuits is implemented using a voltage divider comprising two resistors. A first problem in such circuits is that the voltage level-shift across one of the resistors is not constant but depends on the voltage across the capacitor. Another disadvantage is that the current flowing through the resistors is temperature dependent because of the temperature dependency of the resistors. One solution to this problem is to provide resistors having sufficiently large resistance to minimize the temperature dependency. However, in order to provide resistors having sufficiently large resistance a substantially larger die area is consumed by the resistors.

Based upon the foregoing, there is a need to provide a capacitor measuring circuit capable of producing an accurate temperature independent current and an accurate temperature independent voltage level-shift that uses a smaller die area.

It is, therefore, an object of the invention to provide a system for diagnosing impedances capable of producing an accurate temperature independent current and an accurate temperature independent voltage level-shift.

It is further an object of the invention to provide a system for diagnosing impedances capable of producing an accurate temperature independent current and an accurate temperature independent voltage level-shift that uses a small die area.

In accordance with the present invention there is provided a system for measuring impedance of an electronic component comprising: a temperature compensated current source I connected in parallel to the electronic component between a supply plane $V_C$ and ground for providing a predetermined substantially constant current to the electronic component; and, a temperature compensated voltage level-shift connected between the supply plane $V_C$ and the ground in parallel to the electronic component for sensing a voltage across the electronic component and for providing a level-shifted output voltage $V_{out}$ in dependence thereupon.

In accordance with an aspect of the present invention there is provided a storage medium having data stored therein, the data for when executed resulting in an integrated circuit design of a system for measuring impedance of an electronic component comprising: a temperature compensated current source I connected in parallel to the electronic component between a supply plane $V_C$ and ground for providing a predetermined substantially constant current to the electronic component; and, a temperature compensated voltage level-shift connected between the supply plane $V_C$ and the ground in parallel to the electronic component for sensing a voltage across the electronic component and for providing a level-shifted output voltage $V_{out}$ in dependence thereupon.

In accordance with the present invention there is further provided a method for measuring impedance of an electronic component comprising: providing a predetermined substantially constant current to the electronic component by connecting a temperature compensated current source I in parallel to the electronic component between a supply plane $V_C$ and ground; sensing a voltage across the electronic component and for providing a level-shifted output voltage $V_{out}$ in dependence thereupon by connecting a temperature compensated voltage level-shift between the supply plane $V_C$ and the ground in parallel to the electronic component.

In accordance with the present invention there is further provided a system for measuring impedance of an electronic component comprising: a current source $I_2$ connected in parallel to the electronic component between a supply plane $V_C$ and ground for providing a current to the electronic component; and, a voltage level-shift connected between the supply plane $V_C$ and the ground in parallel to the electronic component and in parallel to the current source $I_2$, the voltage level-shift for sensing a voltage across the electronic component and for providing a level-shifted output voltage $V_{out}$ in dependence thereupon, the voltage level-shift comprising: at least a resistor $R_1$ connected in series with a current source $I_1$ and an output port interposed between the at least a resistor $R_1$ and the current source $I_1$, the current sources $I_1$ and $I_2$ having opposite temperature coefficients such that the current provided to the electronic component is substantially constant.

In accordance with an aspect of the present invention there is provided a storage medium having data stored therein, the data for when executed resulting in an integrated circuit design of a system for measuring impedance of an electronic component comprising: a current source $I_2$ connected in parallel to the electronic component between a supply plane $V_C$ and ground for providing a current to the electronic component; and, a voltage level-shift connected between the supply plane $V_C$ and the ground in parallel to the electronic component and in parallel to the current source $I_2$, the voltage level-shift for sensing a voltage across the electronic component and for providing a level-shifted output voltage $V_{out}$ in dependence thereupon, the voltage level-shift comprising: at least a resistor $R_1$ connected in series with a current source $I_1$ and an output port interposed between the at least a resistor $R_1$ and the current source $I_1$, the current sources $I_1$ and $I_2$ having opposite temperature coefficients such that the current provided to the electronic component is substantially constant.

In accordance with the present invention there is further provided a method for measuring impedance of an electronic component comprising: providing a current to the electronic component by connecting a current source $I_2$ in parallel to the electronic component between a supply plane $V_C$ and ground; and, sensing a voltage across the electronic component and providing a level-shifted output voltage $V_{out}$ in dependence thereupon by connecting a voltage level-shift between the supply plane $V_C$ and the ground in parallel to the electronic component and in parallel to the current source $I_2$, the voltage level-shift comprising at least a resistor $R_1$ connected in series with a current source $I_1$ and an output port interposed between the at least a resistor $R_1$ and the current source $I_1$, the current sources $I_1$ and $I_2$ having opposite temperature coefficients such that the current provided to the electronic component is substantially constant.

Exemplary embodiments of the invention will now be described in conjunction with the following drawings, in which:

FIG. 7b is a simplified circuit diagram schematically illustrating an alternative capacitor test according to the invention to the one shown in FIG. 7a;

In the following description the various embodiments of the invention will be illustrated in combination with the measuring of a capacitor. As will become evident to those of skill in the art, all the circuits are extendable for measuring impedances of other electronic components as well.

Figure 1A:
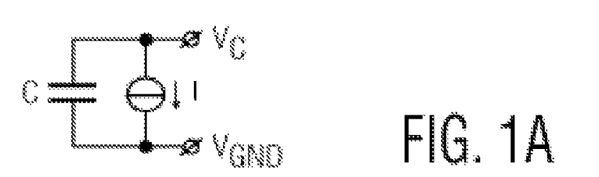
FIG. 1a is a simplified circuit diagram schematically illustrating a capacitor test.
Figure 1B:
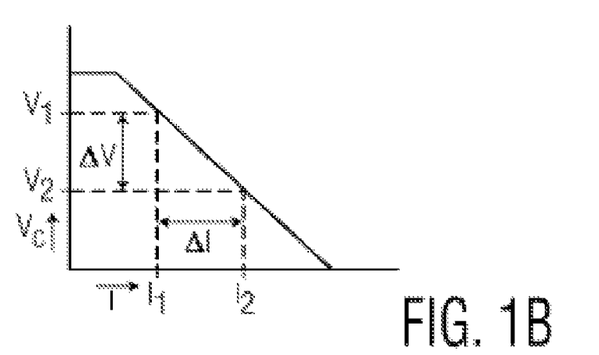
FIG. 1b is a simplified diagram schematically illustrating capacitor voltage as a function of time.

Capacitors are used, for example, in airbag safety systems to store the energy required to fire the airbag detonators. In order to guarantee reliable operation of these safety systems the capacitors are diagnosed. The capacitance of a capacitor is measured using, for example, the circuit shown in FIG. 1a. A current I is drawn from capacitor C resulting in a voltage decreasing with time, as shown in FIG. 1b. By measuring the time interval for a fixed voltage drop $\Delta t$, or by measuring the voltage drop $\Delta V$ for a fixed time interval $\Delta t$, the capacitance is determined as:

$$C = \frac{I \Delta t}{\Delta V} \quad (1)$$

Figure 2A:
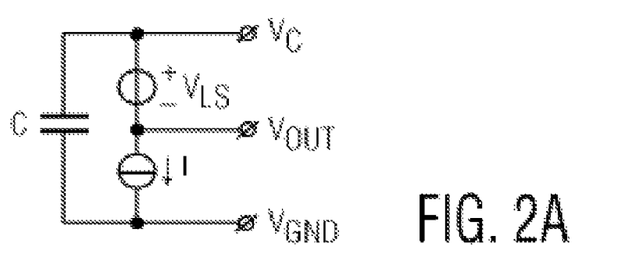
FIG. 2a is a simplified circuit diagram schematically illustrating a capacitor test with voltage level-shift in series with a current source.
Figure 2B:
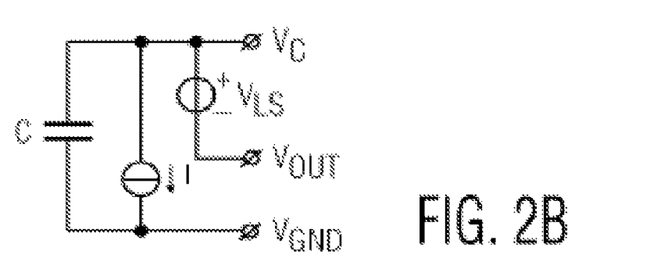
FIG. 2b is a simplified circuit diagram schematically illustrating a capacitor test with voltage level-shift in parallel with a current source.

Since the capacitance is voltage dependent, it needs to be measured at an operating voltage, which is approximately 20V in airbag systems. Therefore, a voltage level-shift is needed to reduce the voltage into the range of a supply voltage in order to be easily processed. The voltage level-shift $V_{LS}$ is placed in series with the current source I, as shown in FIG. 2a or in parallel, as shown in FIG. 2b.

Figure 3:
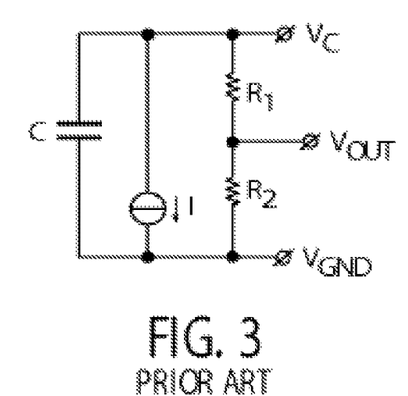
FIG. 3 is a simplified circuit diagram schematically illustrating a prior art capacitor test with voltage level-shift.

The conventional method of implementing the voltage level-shift into a capacitor measuring circuit is shown FIG. 3. Current source I discharges capacitor C. In order to create a well defined slope it is desired for the current source I to be temperature and process independent. A voltage level-shift is implemented using a voltage divider comprising resistors $R_1$ and $R_2$ for shifting the output voltage $V_{out}$ inside a supply voltage range. A first problem is that the voltage level-shift across resistor $R_1$ is not constant, but depends on the voltage $V_C$ across the capacitor C. Another more important problem is that the current flowing through the resistors is temperature dependent because of the temperature dependency of the resistors. Provision of sufficiently large resistors minimizes the temperature dependency, however, at the cost of a substantially larger die area being consumed by the resistors.

Figure 4:
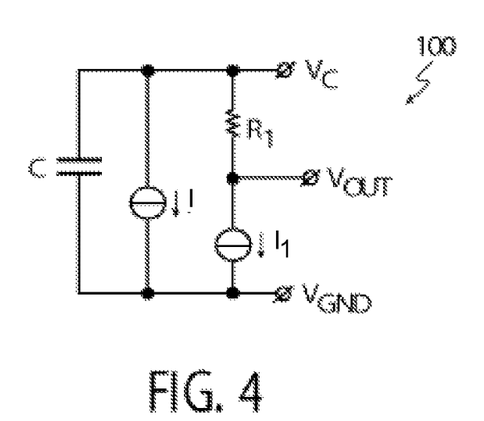
FIG. 4 is a simplified circuit diagram schematically illustrating a capacitor test with constant voltage level-shift according to the present invention.

Referring to FIG. 4, a capacitor measuring circuit 100 with a constant voltage level-shift according to the invention is shown. Again, a current source I is used to discharge capacitor C. The voltage level-shift is implemented using resistor $R_1$ and current source $I_1$. With the current source $I_1$ being determined by a reference voltage $V_{REF}$, which is, for example, generated using a bandgap reference circuit, and a reference resistor $R_{REF}$, which matches with the resistor $R_1$, the current $I_1$ is given by:

$$I_1 = \frac{V_{REF}}{R_{REF}} \quad (2)$$

resulting in a temperature and process independent voltage level-shift across the resistor $R_1$. However, the current $I_1$ is affected by the temperature dependency of the resistor $R_1$ and is drawn from the capacitor C. Therefore, it is necessary that the current $I_1$ is sufficiently small and the resistance of the resistor $R_1$ needs to be sufficiently large, thus consuming a large die area.

Figure 5:
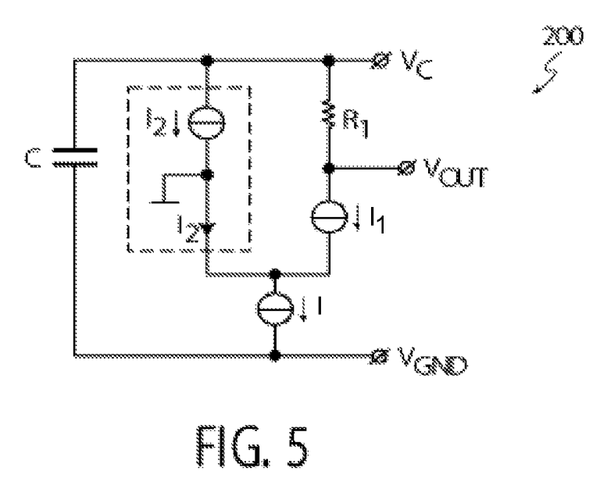
FIG. 5 is a simplified circuit diagram schematically illustrating a capacitor test with a current source in series with a constant voltage level-shift according to the present invention.

By placing the current source I in series with the constant voltage level-shift, as shown in FIG. 5 depicting a second embodiment 200 of a capacitor measuring circuit according to the invention, an accurate voltage level-shift is combined with an accurate current source. The circuit depicted in the dashed box measures a difference current $I_2$ between current I and current $I_1$. The difference current $I_2$ is then drawn from the capacitor C resulting in a total current drawn from the capacitor being equal to the current I. The voltage level-shift is implemented using resistor $R_1$ and current source $I_1$. By deriving $I_1$ from a reference voltage $V_{REF}$ and a reference resistor $R_{REF}$ that matches resistor $R_1$ an accurate temperature independent and process independent voltage level-shift is created across resistor $R_1$. Therefore, the capacitor measuring circuit 200 provides an accurate temperature and process independent voltage level-shift combined with an accurate temperature and process independent current source.

Figure 6:
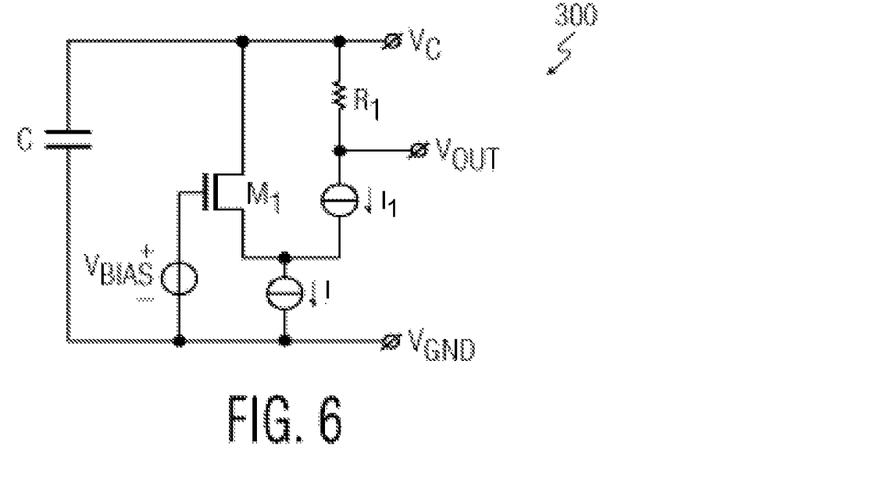
FIG. 6 is a simplified circuit diagram schematically illustrating a capacitor test with a current source in series with a constant voltage level-shift using a cascode transistor according to the present invention.

The circuit depicted in the dashed box in FIG. 5 is implemented, for example, using a cascode $M_1$, as shown in FIG. 6 depicting a third embodiment 300 of a capacitor measuring circuit according to the invention. The cascode $M_1$ directs the part of the accurate current that is not used by current source $I_1$ around $I_1$ to the capacitor C. It is noted that some difficulties arise with the implementation of the floating current source $I_1$ and that some headroom is necessary to properly bias the two current sources $I_1$ and I connected in series, limiting the signal swing at output $V_{out}$.

Figure 7A:
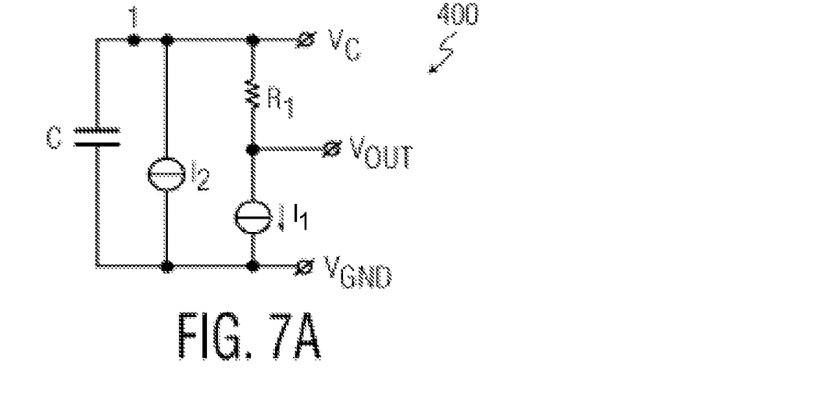
FIG. 7a is a simplified circuit diagram schematically illustrating a capacitor test with a current source in parallel with a constant voltage level-shift according to the present invention.

Referring to FIG. 7a, a fourth embodiment 400 of a capacitor measuring circuit according to the invention is shown. Here, current sources $I_1$ and $I_2$ are connected in parallel and to ground. The voltage level-shift is again implemented using resistor $R_1$ and current source $I_1$, with the current source $I_1$ being again determined by a reference voltage $V_{REF}$ and a reference resistor $R_{REF}$. The current source $I_2$ compensates the temperature dependency of current source $I_1$. If, for example, the resistors $R_1$ and $R_{REF}$ have a positive temperature coefficient then current source $I_1$ has a negative temperature coefficient and, therefore, current source $I_2$ is designed to have a positive temperature coefficient. Therefore, the capacitor measuring circuit 400 provides an accurate temperature and process independent voltage level-shift combined with an accurate temperature and process independent current source. Further, the grounding of current source $I_1$ reduces the required headroom allowing larger signal swing at output $V_{out}$.

Figure 8A:
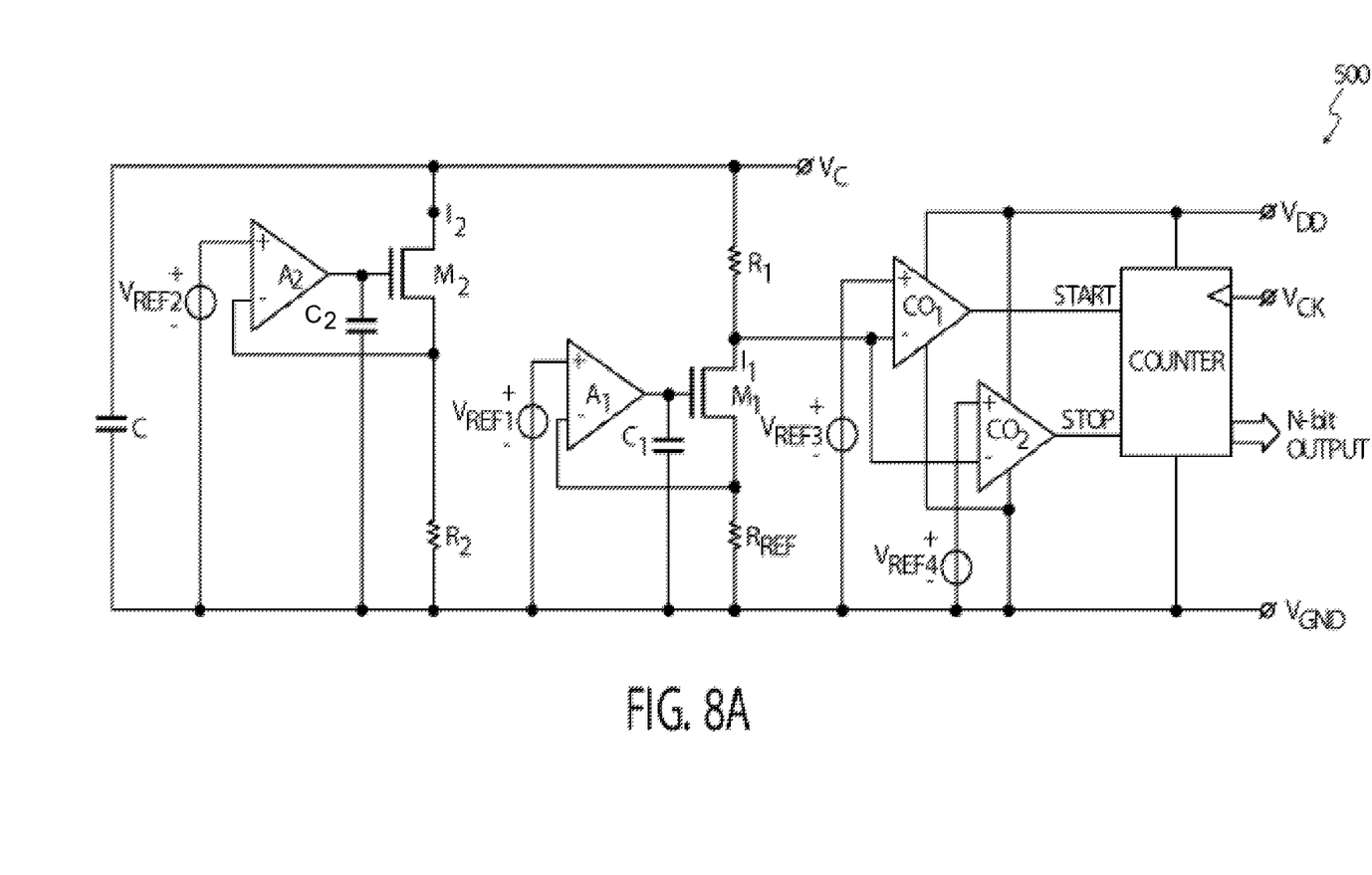
FIG. 8a is a simplified circuit diagram schematically illustrating a capacitor measurement system according to the present invention.

FIG. 8a illustrates a complete system implementation 500 according to the invention of the capacitor measurement circuit 400 shown in FIG. 7a. The voltage level-shift is implemented using resistor $R_1$ and a current source comprising a V-I converter that converts a reference voltage $V_{REF1}$ into a current using resistor $R_{REF}$. The V-I converter comprises amplifier $A_1$, transistor $M_1$, resistor $R_{REF}$, and capacitor $C_1$. Alternatively, a cascode is used in place of the V-I converter with the gate-source voltage of the cascode being compensated for using a similar transistor in the reference voltage driving the gate of the cascode. However, this alternative is less accurate. A feedback loop around the amplifier $A_1$ and the transistor $M_1$ controls the voltage across the resistor $R_{REF}$ such that the voltage is equal to the reference voltage $V_{REF1}$ yielding a current determined by the resistor $R_{REF}$ and the reference voltage $V_{REF1}$. This current is then drawn from capacitor C—which is to be measured—via the transistor $M_1$ and the resistor $R_1$. Thus, an accurate level-shift voltage across resistor $R_1$ is obtained determined by the reference voltage $V_{REF1}$ and the ratio of the resistors $R_1$ and $R_{REF}$. The capacitor $C_1$ is needed for frequency compensation of the V-I converter. Current $I_2$ is created using a similar V-I converter comprising amplifier $A_2$, transistor $M_2$, resistor $R_2$, and capacitor $C_2$, such that the current $I_2$ is determined by reference voltage $V_{REF1}$ and resistor $R_2$. The level-shifted voltage at the drain of transistor $M_1$ is monitored by comparators $CO_1$ and $CO_2$. When the level-shifted voltage crosses reference voltage $V_{REF3}$ a counter is started and when the level-shifted voltage crosses reference voltage $V_{REF4}$ the counter is stopped yielding a digital n-bit output proportional to the capacitor value of capacitor C and a time interval determined by a digital clock voltage $V_{CK}$.

The currents need to be temperature compensated. When resistors with positive and negative temperature coefficients are available, temperature compensation is achieved by combining a resistor with a positive temperature coefficient and a resistor with a negative temperature coefficient for each resistor shown in FIG. 8a. To obtain sufficient accuracy, resistor $R_2$ is trimmed such that an absolute value spread of the resistors is compensated. Alternatively, temperature compensation is implemented by using single resistors for resistor $R_1$ and reference resistor $R_{REF}$ and using only a combination resistor for resistor $R_2$ such that the temperature variation of the current $I_1$ is compensated by the current $I_2$. The transistors $M_1$ and $M_2$ are, for example, implemented as high-voltage DMOS transistors because of the high voltage across capacitor C. Furthermore, the inputs of the comparators $CO_1$ and $CO_2$ are protected when the circuit is not used and the current source $I_1$ is switched off. The protection is implemented, for example, using a switch between the drain of transistor $M_1$ and the comparator inputs and a clamping device connected between the two negative inputs of the comparators $CO_1$ and $CO_2$ and ground.

Figure 7B:
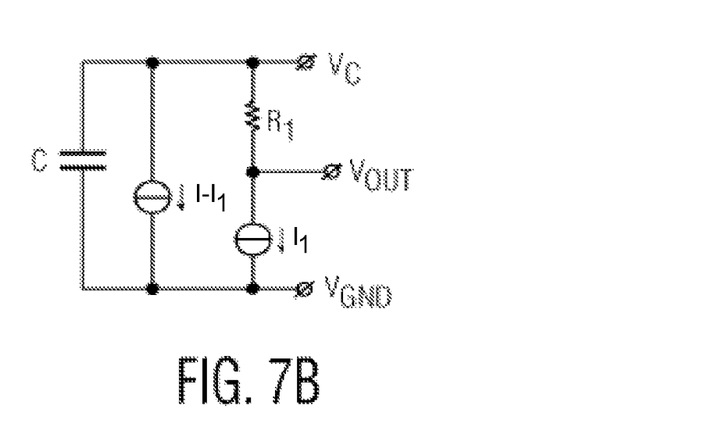

Alternatively, the current source $I_2$, depicted in FIG. 7a, is replaced by a current source $I-I_1$, as shown in FIG. 7b. Again, a current $I_1$ is implemented using a voltage based on a bandgap voltage and a resistor similar to $R_1$ draws current from $R_1$ yielding an accurate voltage level shift across $R_1$. The second current source, however, is now created by simply subtracting $I_1$ from a constant temperature independent current I. The result is that the current drawn from the capacitor C is identical to the constant current I.

Figure 8B:
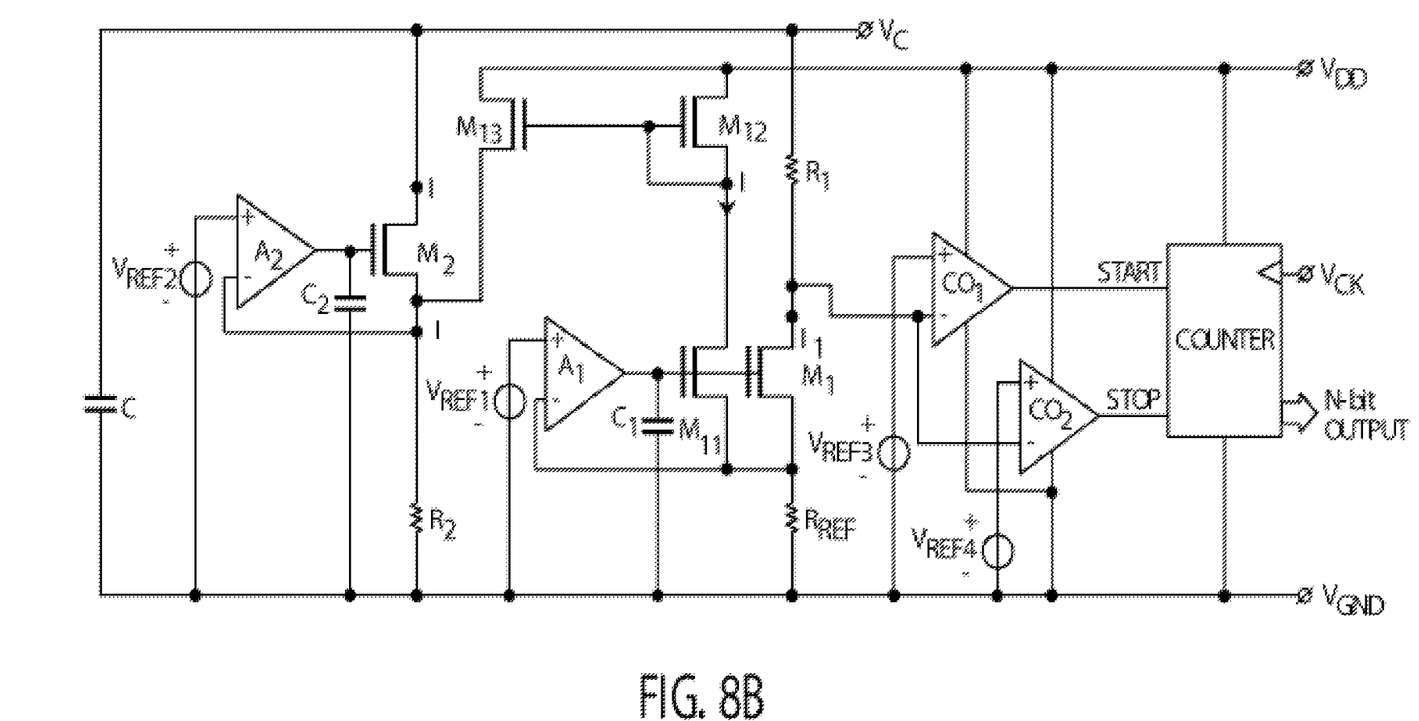
FIG. 8b is a simplified circuit diagram schematically illustrating an alternative capacitor measurement system according to the present invention implementing the circuit shown in FIG. 7b.

Referring to FIG. 8b, the circuit depicted in FIG. 7b has been incorporated into the system implementation shown in FIG. 8a. The circuit is similar to the one depicted in FIG. 8a. However, a copy of the current I is now created using $M_{11}$. The copy of $I_1$ is then subtracted from the constant current I using $M_{12}$ and $M_{13}$. Thus, the current flowing through $M_2$ is equal to $I-I_1$. Since both $I-I_1$ and $I_1$ are drawn from the capacitor C, the total current drawn from C is the constant current I. By trimming resistor $R_2$ and using a combination of resistors with positive and negative temperature coefficients the current I is accurate and temperature independent.

Figure 9:
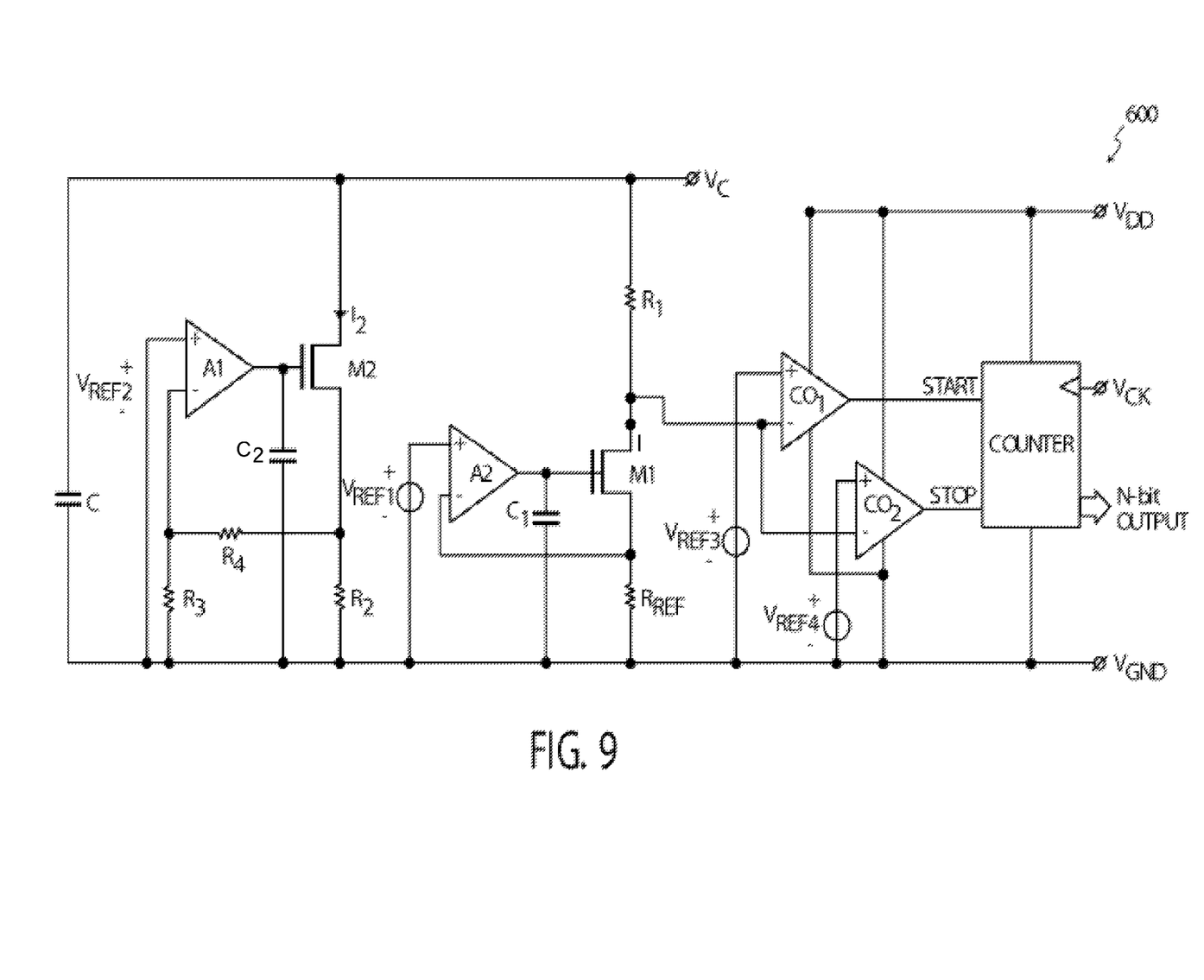
FIG. 9 is a simplified circuit diagram schematically illustrating another capacitor measurement system according to the present invention; and, FIG. 10 is a simplified circuit diagram schematically illustrating yet another capacitor measurement system according to the present invention.

If only resistors with a positive temperature coefficient are available, the system implementation 600 according to the invention, as shown in FIG. 9, is used. The circuit is identical to the circuit shown in FIG. 8a except for resistors $R_3$ and $R_4$. By ensuring that the temperature coefficient of $R_4$ is larger than the temperature coefficients of the other resistors, the voltage across resistor R2 increases with rising temperature compensating the increase of the resistance resulting in a temperature independent current. To compensate the temperature variation of current $I_1$, current source $I_2$ is overcompensated.

Figure 10:
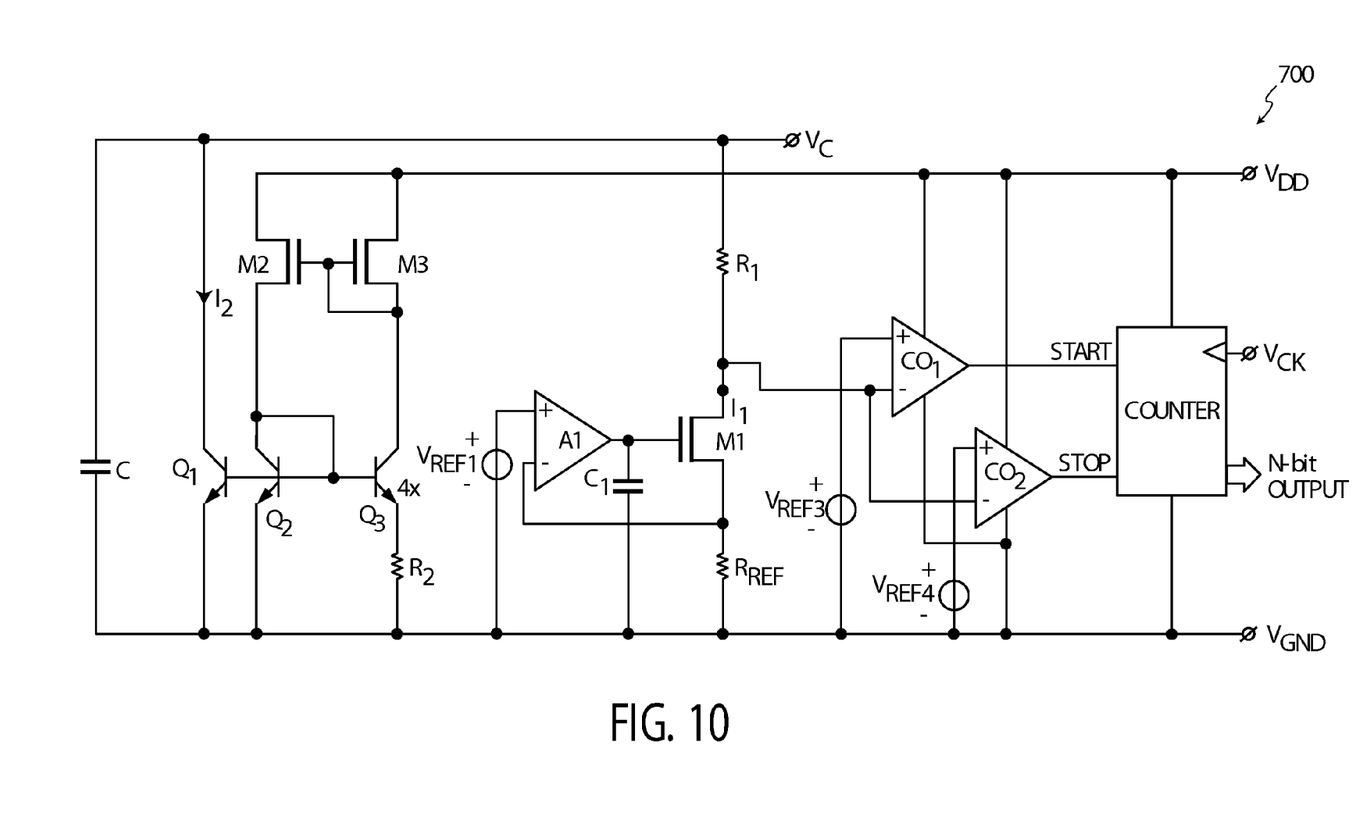

A different implementation of the current source $I_2$ is realized in the system implementation 700 according to the invention, shown in FIG. 10. Here, the current source $I_2$ is implemented using a PTAT current source comprising transistors $Q_2$, $Q_3$, $M_2$, and $M_3$, and resistor $R_2$. The bias current of the PTAT source is mirrored out by transistor $Q_1$. The PTAT current source generates a voltage proportional to the absolute temperature across the resistor R2. The temperature variation of this voltage compensates the temperature variation of the resistor $R_2$ yielding a current $I_2$ substantially insensitive to temperature. Further tuning is obtained by using a combination of resistors with two different positive temperature coefficients for resistor $R_2$, which also provides compensation of the temperature variation of current $I_1$.

Numerous other embodiments of the invention will be apparent to persons skilled in the art without departing from the spirit and scope of the invention as defined in the appended claims.

What is claimed is:

1. A system for measuring impedance of an electronic component comprising:
   a temperature compensated current source (I) connected in parallel to the electronic component (C) between a supply plane ($V_C$) and ground ($V_{GND}$) for providing a predetermined substantially constant current to the electronic component (C); and,
   a temperature compensated voltage level-shift connected between the supply plane ($V_C$) and the ground ($V_{GND}$) in parallel to the electronic component for sensing a voltage across the electronic component (C) and for providing a level-shifted output voltage $V_{out}$ in dependence thereupon;

wherein the temperature compensated voltage level-shift comprises at least a resistor ($R_1$) connected in series with a current source ($I_1$) and an output port interposed between the at least a resistor ($R_1$) and the current source ($I_1$); and wherein the at least a resistor ($R_1$) comprises two resistors having opposite temperature coefficients.

2. A system for measuring impedance of an electronic component as defined in claim 1 wherein the temperature compensated current source (I) and the temperature compensated voltage level-shift are connected in series.

3. A system for measuring impedance of an electronic component as defined in claim 1, wherein the electronic component (C) comprises a capacitor.

4. A system for measuring impedance of an electronic component as defined in claim 1, wherein the electronic component (C) comprises a storage capacitor of an airbag system.

5. A system for measuring impedance of an electronic component as defined in claim 1, comprising compensation circuitry connected in parallel to the temperature compensated voltage level-shift for providing a current being a difference between the currents provided by the current sources (I) and ($I_1$).

6. A system for measuring impedance of an electronic component as defined in claim 5, wherein the compensation circuitry comprises a cascode.

7. A system for measuring impedance of an electronic component comprising:
  a current source ($I_2$) connected in parallel to the electronic component (C) between a supply plane ($V_C$) and ground ($V_{GND}$) for providing a current to the electronic component (C); and,
  a voltage level-shift connected between the supply plane ($V_C$) and the ground ($V_{GND}$) in parallel to the electronic component (C) and in parallel to the current source ($I_2$), the voltage level-shift for sensing a voltage across the electronic component (C) and for providing a level-shifted output voltage $V_{out}$ in dependence thereupon, the voltage level-shift comprising:
    at least a resistor ($R_1$) connected in series with a current source ($I_1$) and
    an output port interposed between the at least a resistor ($R_1$) and the current source ($I_1$), the current sources ($I_1$) and ($I_2$) having opposite temperature coefficients such that the current provided to the electronic component is substantially constant;
  wherein the voltage level-shift comprises a V-I converter for providing a current in dependence upon a resistance of a reference resistor ($R_{REF1}$) and a reference voltage $V_{REF1}$ across the reference resistor ($R_{REF1}$).

8. A system for measuring impedance of an electronic component as defined in claim 7 wherein the V-I converter comprises a transistor and an amplifier connected to the base of the transistor.

9. A system for measuring impedance of an electronic component as defined in claim 7, wherein the current source ($I_2$) comprises a V-I converter.

10. A system for measuring impedance of an electronic component as defined in claim 7, wherein the current source ($I_2$) comprises a PTAT current source.

11. A system for measuring impedance of an electronic component as defined in claim 7, wherein the electronic component (C) comprises a capacitor.

12. A system for measuring impedance of an electronic component as defined in claim 7, wherein the electronic component (C) comprises a storage capacitor of an airbag system.

13. A system for measuring impedance of an electronic component as defined in claim 7, further comprising:
  a start comparator ($CO_1$) in communication with the output port,
  a start reference voltage source ($V_{REF3}$), and
  a counter, for comparing the output voltage $V_{out}$ with the start reference voltage and providing a comparison result, and if the comparison result is indicative of a match providing a signal in dependence thereupon to the counter; and,
  a stop comparator ($CO_2$) in communication with the output port,
  a stop reference voltage source ($V_{REF4}$), and the counter, for comparing the output voltage $V_{out}$ with the stop reference voltage and providing a comparison result, and if the comparison result is indicative of a match providing a signal in dependence thereupon to the counter.

14. A system for measuring impedance of an electronic component as defined in claim 13 comprising a digital clock in communication with the counter for determining a time interval between start and stop of the counter.

15. A system for measuring impedance of an electronic component comprising:
  a current source ($I_2$) connected in parallel to the electronic component (C) between a supply plane ($V_C$) and ground ($V_{GND}$) for providing a current to the electronic component (C); and,
  a voltage level-shift connected between the supply plane ($V_C$) and the ground ($V_{GND}$) in parallel to the electronic component (C) and in parallel to the current source ($I_2$), the voltage level-shift for sensing a voltage across the electronic component (C) and for providing a level-shifted output voltage $V_{out}$ in dependence thereupon, the voltage level-shift comprising:
    at least a resistor ($R_1$) connected in series with a current source ($I_1$) and
    an output port interposed between the at least a resistor ($R_1$) and the current source ($I_1$), the current sources ($I_1$) and ($I_2$) having opposite temperature coefficients such that the current provided to the electronic component is substantially constant;
  wherein the current source ($I_2$) comprises a V-I converter.

16. A system for measuring impedance of an electronic component comprising:
  a current source ($I_2$) connected in parallel to the electronic component (C) between a supply plane ($V_C$) and ground ($V_{GND}$) for providing a current to the electronic component (C); and,
  a voltage level-shift connected between the supply plane ($V_C$) and the ground ($V_{GND}$) in parallel to the electronic component (C) and in parallel to the current source ($I_2$), the voltage level-shift for sensing a voltage across the electronic component (C) and for providing a level-shifted output voltage $V_{out}$ in dependence thereupon, the voltage level-shift comprising:
    at least a resistor ($R_1$) connected in series with a current source ($I_1$) and
    an output port interposed between the at least a resistor ($R_1$) and the current source ($I_1$), the current sources ($I_1$) and ($I_2$) having opposite temperature coefficients such that the current provided to the electronic component is substantially constant;

further comprising:
    a start comparator ($CO_1$) in communication with the output port,
    a start reference voltage source ($V_{REF3}$), and
    a counter, for comparing the output voltage $V_{out}$ with the start reference voltage and providing a comparison result, and if the comparison result is indicative of a match providing a signal in dependence thereupon to the counter; and,
    a stop comparator ($CO_2$) in communication with the output port,
        a stop reference voltage source ($V_{REF4}$), and the counter, for comparing the output voltage $V_{out}$ with the stop reference voltage and providing a comparison result, and if the comparison result is indicative of a match providing a signal in dependence thereupon to the counter.

17. A system for measuring impedance of an electronic component as defined in claim 16 comprising a digital clock in communication with the counter for determining a time interval between start and stop of the counter.

18. A system for measuring impedance of an electronic component comprising:
    a current source ($I_2$) connected in parallel to the electronic component (C) between a supply plane ($V_C$) and ground ($V_{GND}$) for providing a current to the electronic component (C); and,
    a voltage level-shift connected between the supply plane ($V_C$) and the ground ($V_{GND}$) in parallel to the electronic component (C) and in parallel to the current source ($I_2$), the voltage level-shift for sensing a voltage across the electronic component (C) and for providing a level-shifted output voltage $V_{out}$ in dependence thereupon, the voltage level-shift comprising:
        at least a resistor ($R_1$) connected in series with a current source ($I_1$) and
        an output port interposed between the at least a resistor ($R_1$) and the current source ($I_1$), the current sources ($I_1$) and ($I_2$) having opposite temperature coefficients such that the current provided to the electronic component is substantially constant;
    wherein the current source ($I_2$) comprises a PTAT current source.

* * * * *